United States Patent
Oikawa

(10) Patent No.: US 6,351,000 B1
(45) Date of Patent: Feb. 26, 2002

(54) SEMICONDUCTOR HAVING A HETEROJUNCTION FORMED BETWEEN A PLURALITY OF SEMICONDUCTOR LAYERS

(75) Inventor: Ryuichi Oikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/587,335

(22) Filed: Jun. 5, 2000

(30) Foreign Application Priority Data

Jun. 3, 1999 (JP) ............................................. 11-157117

(51) Int. Cl.[7] .......................................... H01L 31/0328
(52) U.S. Cl. ...................................... 257/194; 257/192
(58) Field of Search ......................................... 257/194

(56) References Cited

U.S. PATENT DOCUMENTS

| | | | |
|---|---|---|---|
| 5,038,187 A | * 8/1991 | Zhou | 357/22 |
| 5,473,175 A | * 12/1995 | Nikaido et al. | 257/192 |
| 5,504,353 A | * 4/1996 | Kuzuhara | 257/194 |
| 5,959,317 A | * 9/1999 | Niwa | 257/194 |

FOREIGN PATENT DOCUMENTS

| | | | |
|---|---|---|---|
| JP | 4-125939 | 4/1992 | |
| JP | 8-148674 | * 6/1996 | ......... H01L/29/778 |
| JP | 9-283444 | * 10/1997 | ......... H01L/21/203 |

* cited by examiner

Primary Examiner—Tom Thomas
Assistant Examiner—Ori Nadav
(74) Attorney, Agent, or Firm—Scully, Scott, Murphy & Presser

(57) ABSTRACT

A semiconductor device is capable of reducing the parasitic resistance thereof without using any expensive special technique; increasing any leak current thereof; and, decreasing a gate breakdown strength thereof. In the device, for example, an undoped InGaAs layer serving as a channel layer is formed on a semi-insulating GaAs layer or the like. A first n-type AlGaAs layer, a second n-type AlGaAs layer and a third n-type AlGaAs layer are successively piled up on the undoped InGaAs layer in this order to form a carrier supply layer, wherein the second n-type AlGaAs layer is the lowest in impurity concentration among the first n-type AlGaAs layer, the second n-type AlGaAs layer, and the thirst n-type AlGaAs layer.

15 Claims, 12 Drawing Sheets

SEMICONDUCTOR HAVING A HETEROJUNCTION FORMED BETWEEN A PLURALITY OF SEMICONDUCTOR LAYERS

BACKGROUND OF THE INVENTION

1. Field of the Invention

The present invention relates to a semiconductor device, its production method and a semiconductor substrate structure of the device, and more particularly to: a semiconductor device constructed of an HEMT(High Electron Mobility Transistor), wherein a heterojunction is formed between adjacent compound semiconductor layers; a production method of the semiconductor device; and, a semiconductor substrate structure of the device.

2. Description of the Related Art

The HEMT, which is well known as a kind of FET(Field Effect Transistor), is not only capable of performing a high speed operation owing to the advantage of a so-called "high electron mobility" thereof, but also capable of operating in a superhigh frequency band, for example such as a microwave band and the like to output a large power with high efficiency. Consequently, the HEMT is widely used as a power transistor for use in a transmitter's output unit and the like mounted on a satellite communication instruments and the like.

FIG. 12 is a cross-sectional view of a first conventional semiconductor device constructed of the HEMT described above, illustrating a structure of the device. In this first conventional device, for example, as showning FIG. 12, an undoped InGaAs (indium gallium arsenide) layer 103 serving as a channel layer is formed on a semi-insulating undoped GaAs (gallium arsenide) substrate 101 through a buffer layer 102, wherein the buffer layer 102 is formed of a GaAs layer or the like. Further formed on this undoped InGaAs layer 103 is an n-type AlGaAs layer 104 which serves as a carrier supply layer. Formed between the undoped InGaAs layer 103 and the n-type AlGaAs layer 104 is a heterojunction.

A gate electrode 105 which is made of, for example such as WSi (tungsten silicide) is formed in a central portion of the n-type AlGaAs (carrier supply) layer 104 to form a Schottky junction therein. Formed opposite sides of the gate electrode 105 are: a source contact layer 106 formed of, for example such as an n-type GaAs layer; and, a drain contact layer 107 formed of, for example such as an n-type GaAs layer. A source electrode 108 and a drain electrode 109 are formed in the source contact layer 106 and the drain contact layer 107, respectively. An oxide film 110 is formed in a recess portion formed between the gate electrode 105 and each of the source contact layer 106 and the drain contact layer 107, so that the gate electrode 105 is spaced apart from each of the source contact layer 106 and the drain contact layer 107 by a distance corresponding to a film thickness of the oxide film 110.

In the above structure shown in FIG. 12, carriers are supplied from the n-type AlGaAs layer 104 to a surface of the undoped InGaAs layer 103 to form a two-dimensional electron layer (hereinafter referred to as the two-dimensional electron gas layer) 112. Electrons in this two-dimensional electron gas layer 112 produce a tunnel current. This tunnel current flows across the n-type AlGaAs layer 104 serving as a carrier supply layer, which makes it possible for the electrons to move between the source electrode 108 and the drain electrode 109, and thereby producing a drain current for supporting in operation the FET. Here, an electron density of the two-dimensional electron gas layer 112 is determined by both of a film thickness and an impurity concentration (hereinafter referred to simply as the concentration) of the n-type AlGaAs layer 104 serving as a carrier supply layer.

By the way, in order to improve the performance of the FET, it is necessary to reduce in level a parasitic resistance appearing in a channel between: the gate electrode 105; and, the source electrode 108 or the drain electrode 109. In order to reduce such parasitic resistance, it is indispensable to increase the concentration of the n-type AlGaAs layer 104 which serves as a carrier supply layer located directly below the gate electrode 105. On the other hand, when the concentration of the n-type AlGaAs layer 104 is increased, a so-called Schottky leak current (hereinafter referred to as the leak current) disadvantageously increases in a condition in which an effective gate breakdown strength disadvantageously decreases. Consequently, with respect to the concentration of the n-type AlGaAs layer 104 serving as a carrier supply layer, the trade-off in efforts to reduce the parasitic resistance is each of the increase of the leak current and the decrease of the gate breakdown strength.

Such trade-off problem mentioned above is solved by a second conventional semiconductor device disclosed in, for example, Japanese Patent Application Laid-Open No. Hei 4-340234. In the second conventional semiconductor device, as shown in FIG. 13: a first high concentration n-type AlGaAs layer 113 is formed on the undoped InGaAs layer 103 to reduce the parasitic resistance, wherein the undoped InGaAs layer 103 serves as a channel layer; and, a second low concentration n-type AlGaAs layer 114 is formed directly under the gate electrode 105 to reduce the leak current and increase the gate breakdown strength, whereby the second low concentration n-type AlGaAs layer 114 is piled on the first high concentration n-type AlGaAs layer 113 to form a double layer portion of a structure shown in FIG. 13.

Further, in this structure of FIG. 13, in order to effectively reduce the parasitic resistance, it is necessary to reduce the dimensions of each of the recess portions defined between the gate electrode 105 and each of the source contact layer 106 and the drain contact layer 107. Consequently, in the second conventional semiconductor device shown in FIG. 13, the gate electrode 105 is formed self-alignedly with the recess's pattern of the source contact layer 106.

However, since the degree of reduction of the parasitic resistance achieved in the above is not sufficient, it is necessary to further reduce the parasitic resistance. In order to further reduce the parasitic resistance, it is considered to be effective that the n-type AlGaAs layer 114 serving as a second carrier supply layer has its impurity concentration partially increased to partially increase the concentration of the second carrier supply layer in the recess portion.

However, as is clear from the structure shown in FIG. 3, all the n-type AlGaAs layer 114 serving as the second carrier supply layer including the above recess portion is so formed as to have the same concentration. As a result, it is not possible for the structure of FIG. 3 to have only the recess portion thereof partially increased in impurity concentration. Consequently, when the second carrier layer is increased in impurity concentration to reduce the parasitic resistance in level, a portion directly under the gate electrode 105 is also increased in its impurity concentration together with the recess portion. This results in both the increase of the leak current and the reduction of the gate breakdown strength, as already described above.

A third conventional semiconductor device (shown in FIG. 14) is disclosed in, for example, Japanese Patent Application Laid-Open No. Hei 4-125939, in which an undoped AlGaAs layer corresponding to the n-type AlGaAs layer 114 serving as the second carrier supply layer shown in FIG. 13 is selectively formed only in a position directly under the gate electrode 105. In this third conventional semiconductor device, as shown in FIG. 14, an n-type AlGaAs layer 131 corresponding to a first carrier supply layer is formed on an undoped GaAs layer 123 serving as a channel layer. Further formed on this n-type AlGaAs layer 131 by a selective deposition process is an undoped AlGaAs layer 132 corresponding to the second carrier supply layer. Formed on this undoped AlGaAs layer 132 thus selectively deposited is the gate electrode 105. The third conventional semiconductor device, which is shown in FIG. 14 and has the above construction, is capable of effectively decreasing the parasitic resistance without increasing the leak current and without decreasing the gate breakdown strength.

On the other hand, a problem to be solved by the present invention is as follows: namely, In the third conventional semiconductor device disclosed in the Japanese Patent Application Laid-Open No. Hei 4-125939, as shown in FIG. 14, since the undoped AlGaAs layer 132 is formed directly under the gate electrode 105 by the selective deposition process, it is difficult to selectively deposit the undoped AlGaAs layer 132 with sufficient reproducibility, which increases the manufacturing cost of the third conventional semiconductor device.

In other words, in forming the undoped AlGaAs layer 132 by such selective deposition process of the Japanese Patent Application Laid-Open No. Hei 4-125939 during the production of the third conventional semiconductor device, it is difficult to establish optimum deposition conditions for forming the undoped AlGaAs layer 132. Due to this, the undoped AlGaAs layer 132 thus deposited tends to contain an abnormal deposition portion in its crystalline structure. Consequently, in order to form the layer 132 with sufficient reproducibility by removing the above-mentioned abnormal deposition portion from its crystalline structure, it is necessary to use an expensive special deposition technique, which increases the manufacturing cost of the third conventional semiconductor device.

SUMMARY OF THE INVENTION

In view of the above, it is an object of the present invention to provide a semiconductor device, its production method and a semiconductor substrate structure of the device, and more particularly to provide: a semiconductor device constructed of an HEMT(High Electron Mobility Transistor), wherein a heterojunction is formed between adjacent compound semiconductor layers; a production method of the semiconductor device; and, a semiconductor substrate structure of the device, without using any expensive special deposition technique increasing the manufacturing cost of the semiconductor device, wherein the semiconductor device of the present invention is capable of reducing its parasitic resistance without increasing a leak current thereof and also without decreasing a gate breakdown strength thereof.

According to a first aspect of the present invention, there is provided:

in a semiconductor device provided with a compound semiconductor substrate on which an undoped compound semiconductor layer serving as a channel layer is formed, wherein a plurality of n-type compound semiconductor layers are successively formed and piled up on the channel layer to form a carrier supply layer, the improvement wherein:

the carrier supply layer is constructed of a first, a second and a third n-type compound semiconductor layer;

the second n-type compound semiconductor layer is the lowest in impurity concentration among the first, the second and the third n-type compound semiconductor layer; and a gate electrode is formed so as to be encircled with the third n-type compound semiconductor layer, and to have a Schottky junction formed in the second n-type compound semiconductor layer.

Also, according to a second aspect of the present invention, there is provided:

in a semiconductor device provided with a compound semiconductor substrate on which an undoped compound semiconductor layer serving as a channel layer is formed, wherein a plurality of n-type compound semiconductor layers are successively formed and piled up on the channel layer to form a carrier supply layer, the improvement wherein:

the carrier supply layer is constructed of a first, a second and a third n-type compound semiconductor layer;

the second n-type compound semiconductor layer is the lowest in impurity concentration among the first, the second and the third n-type compound semiconductor layer;

an etch stop layer is formed on the third n-type compound semiconductor layer through a film thickness compensating layer; and a gate electrode is formed so as to have a Schottky junction formed in the second n-type compound semiconductor layer, wherein the gate electrode is encircled with at least both of the third n-type compound semiconductor layer and the film thickness compensating layer.

In the foregoing first and second aspects, a preferable mode is one wherein the undoped compound semiconductor layer serving as the channel layer is constructed of an InGaAs layer.

Further, a preferable mode is one wherein each of the first, the second and the third n-type compound semiconductor layer forming the carrier supply layer is constructed of an n-type AlGaAs layer.

Still further, a preferable mode is one wherein the film thickness compensating layer is constructed of a high resistance GaAs layer.

A preferable mode is one wherein the etch stop layer is made of the same material as that of the third n-type compound semiconductor layer.

Further, a preferable mode is one wherein each of a source contact layer and a drain contact layer is constructed of an n-type GaAs layer on the third n-type compound semiconductor layer in each of opposite sides of the gate electrode so as to be spaced apart from the gate electrode; and, an insulation film is formed between: each of the source contact layer and the drain contact layer; and, the gate electrode.

Still further, a preferable mode is one wherein the third n-type compound semiconductor layer or the etch stop layer has a film thickness substantially equal to that of a corresponding preform of the third n-type compound semiconductor layer or of the etch stop layer, wherein an exposed portion of the preform has been already removed through a series of etching processes prior to the formation of the gate electrode.

Also, according to a third aspect of the present invention, there is provided:

a production method of a semiconductor device including the steps of:

a channel layer forming step for forming a channel layer on a compound semiconductor substrate through a buffer layer, wherein the channel layer is constructed of an undoped InGaAs layer;

a carrier supply layer forming step for forming a carrier supply layer by successively forming and piling up a first, a second and a third n-type AlGaAs layer on the channel layer in this order to form the carrier supply layer, wherein the second n-type AlGaAs layer is the lowest in impurity concentration among the first, the second and the third n-type AlGaAs layer;

a contact layer forming step for forming a contact layer on the carrier supply layer, wherein the contact layer is constructed of an n-type GaAs layer;

a contact layer dividing step for dividing the contact layer into a source contact layer and a drain contact layer by forming a space portion therebetween, wherein the space portion is formed by selectively etching the contact layer using the third n-type AlGaAs layer of the carrier supply layer as an etch stop layer; and a carrier supply layer selective removing step for selectively removing both an insulation film of the space portion and the third n-type AlGaAs layer of the carrier supply layer by an anisotropic etching process, wherein the insulation film is formed over the entire surface of the semiconductor substrate including the space portion, and the third n-type AlGaAs layer to be selectively removed is located directly under the insulation film of the space portion.

Also, according to a fourth aspect of the present invention, there is provided:

a production method of a semiconductor device including the steps of:

a channel layer forming step for forming a channel layer on a compound semiconductor substrate through a buffer layer, wherein the channel layer is constructed of an undoped InGaAs layer;

a carrier supply layer forming step for forming a carrier supply layer by successively forming and piling up a first, a second and a third n-type AlGaAs layer on the channel layer in this order to form the carrier supply layer, wherein the second n-type AlGaAs layer is the lowest in impurity concentration among the first, the second and the third n-type AlGaAs layer;

an etch stop layer forming step for forming an etch stop layer on the carrier supply layer through a film thickness compensating layer;

a contact layer forming step for forming a contact layer on the etch stop layer, wherein the contact layer is constructed of an n-type GaAs layer;

a contact layer dividing step for dividing the contact layer into a source contact layer and a drain contact layer by forming a space portion therebetween, wherein the space portion is formed by selectively etching the contact layer using the etch stop layer;

an etch stop layer selective removing step for selectively removing both an insulation film of the space portion and the etch stop layer by an anisotropic etching process, wherein the insulation film is formed over the entire surface of the semiconductor substrate including the space portion, and the etch stop layer to be selectively removed is located directly under the insulation film of the space portion; and a carrier supply layer selective removing step for selectively removing both the film thickness compensating layer of the space portion and the third n-type AlGaAs layer of the carrier supply layer, wherein the third n-type AlGaAs layer to be selectively removed is located directly under the film thickness compensating layer.

A preferable mode is one wherein the film thickness compensating layer is constructed of a high resistance GaAs layer; and, the etch stop layer is constructed of an n-type GaAs layer.

Further, a preferable mode is one wherein the production method further includes a gate electrode forming step for forming a gate electrode in a manner such that a Schottky junction is formed in the second n-type AlGaAs layer.

Also, according to a fifth aspect of the present invention, there is provided:

a semiconductor substrate structure including:

an undoped InGaAs layer formed on a compound semiconductor substrate through a buffer layer, wherein the undoped InGaAs layer serves as a channel layer;

a carrier supply layer constructed of a first, a second and a third n-type AlGaAs layer which are successively piled up on the undoped InGaAs layer in this order to form the carrier supply layer, wherein the second n-type AlGaAs layer is the lowest in impurity concentration among the first, the second and the third n-type AlGaAs layer; and a contact layer formed on the third n-type AlGaAs layer, wherein the contact layer is constructed of an n-type GaAs layer.

In the foregoing fifth aspect, a preferable mode is one wherein an etch stop layer constructed of an n-type AlGaAs layer is formed on the third n-type AlGaAs layer through a film thickness compensating layer, wherein the film thickness compensating layer is constructed of a high resistance GaAs layer.

With the above configurations, the undoped compound semiconductor layer serving as the channel layer is formed; successively formed and piled up on this undoped compound semiconductor layer are the first, the second and the third n-type compound semiconductor layer in this order to form the carrier supply layer in which the second n-type compound semiconductor layer is the lowest in impurity concentration among the first, the second and the third n-type compound semiconductor layer; the gate electrode is formed in a manner such that the Schottky junction is formed in the second n-type compound semiconductor layer; and, the third n-type compound semiconductor layer is formed so as to encircle the gate electrode.

Consequently, in a position directly under the gate electrode, there is no layer high in impurity concentration. Further, with the above fifth aspect, it is possible to integrally form a plurality of necessary compound semiconductor layers in producing the semiconductor device constructed of the heterojunction FET.

As a result, it is possible for the present invention to produce the compound semiconductor materials necessary for production of the semiconductor device of the present invention, at a low cost.

Further, without using any expensive special technique, the present invention is capable of reducing the parasitic resistance without increasing the leak current and without decreasing the gate breakdown strength in operation.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1:
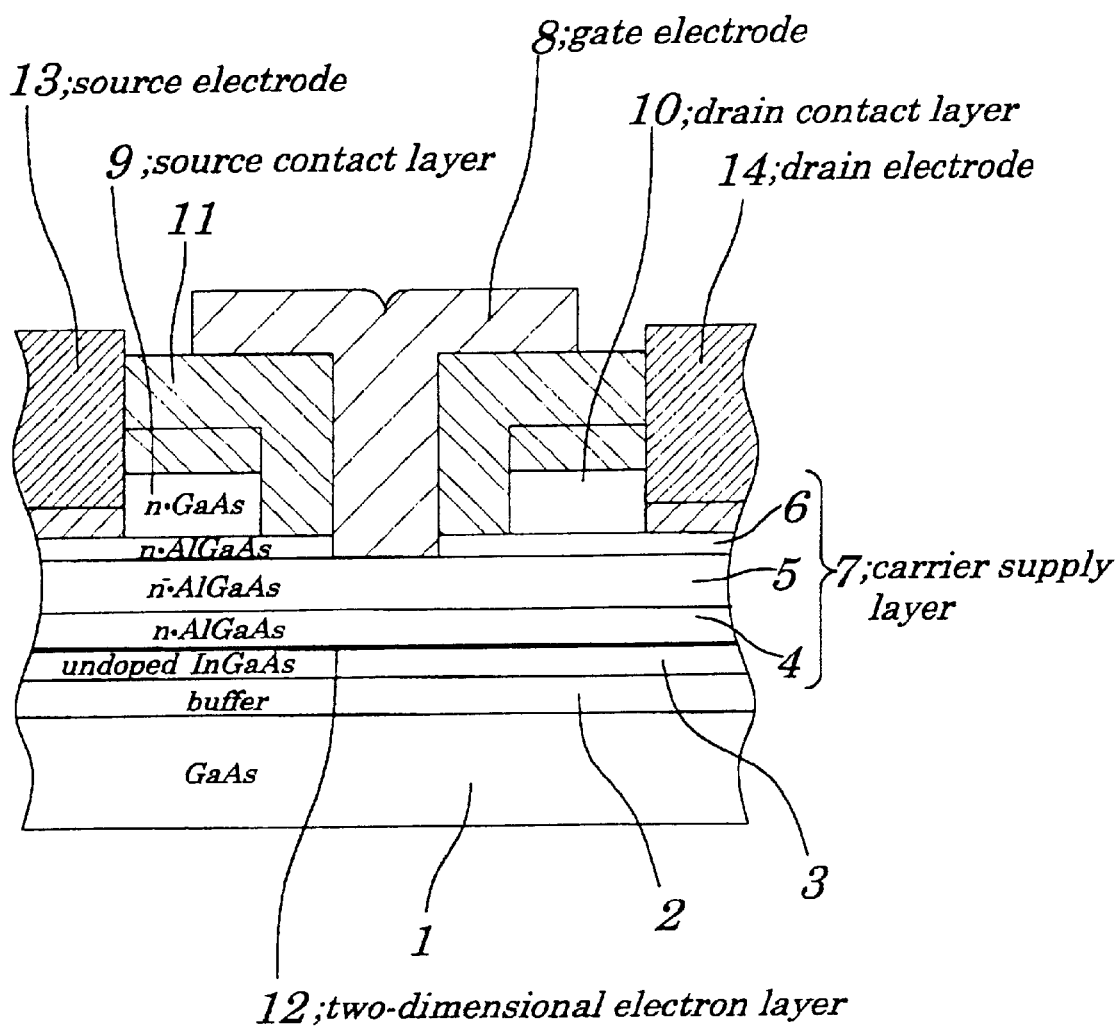
FIG. 1 is a cross-sectional view of a first embodiment of the semiconductor device of the present invention.

The best modes for carrying out the present invention will be described in detail using embodiments of the present invention with reference to the accompanying drawings.

The present invention may, however, be embodied in various different forms and should not be construed as limited to the embodiments set forth herein; rather, these embodiments are provided so that this disclosure will be thorough and complete, and will fully convey the scope of the present invention to those skilled in the art.

In the accompanying drawings, the thickness of films and regions are exaggerated for clarity. Like reference numerals refer to like parts throughout the drawings.

Incidentally, it will also be understood that when a layer or film is referred to as being "on" another film or substrate, it can be directly on such another film or substrate, or intervening films may also be present therebetween.

First Embodiment

FIG. 1 shows a first embodiment of a semiconductor device of the present invention. As shown in FIG. 1, in the first embodiment, for example, an undoped InGaAs layer 3 serving as a channel layer is formed on a semi-insulating GaAs substrate 1 through a buffer layer 2 which is formed of a GaAs layer or the like. Successively formed and piled up on this undoped InGaAs layer 3 are a first n-type AlGaAs layer 4, a second n-type AlGaAs layer 5 and a third i-type AlGaAs layer 6 to form a carrier supply layer 7, wherein the second n-type AlGaAs layer 4 is the lowest in impurity concentration among the first n-type AlGaAs layer 4, the second n-type AlGaAs layer 5 and the third n-type AlGaAs layer 6.

The first n-type AlGaAs layer 4 has a film thickness of from 8 to 12 nm, and an impurity concentration of from $2 \times 10^{17}/cm^3$ to $4 \times 10^{17/cm3}$. The second n-type AlGaAs layer 5 has a film thickness of from 18 to 22 nm, and an impurity concentration of from $1 \times 10^{17}/cm^3$ to $5 \times 10^{17}/cm^3$. The third n-type AlGaAs layer 6 has a film thickness of from 3 to 8 nm, and an impurity concentration of from $3 \times 10^{18}/cm^3$ to $5 \times 10^{18}/cm^3$.

On the other hand, a gate electrode 8 made of Wsi (tungsten silicide) is formed in a manner such that a Schottky junction is formed in the second n-type AlGaAs layer 5. The third n-type AlGaAs layer 6 is formed so as to be disposed adjacent to each of opposite sides of the gate electrode 8. Formed on the third n-type AlGaAs layer 6 in the opposite sides of the gate electrode 8 so as to be spaced apart from the opposite sides are a source contact layer 9 and a drain contact layer 10.

For example, each of the source contact layer 9 and the drain contact layer 10 is constructed of an n-type GaAs layer, and has a film thickness of from 50 to 100 nm and an impurity concentration of from $2 \times 10^{18}/cm^3$ to $4 \times 10^{18}/cm^3$. A recess portion is formed between the gate electrode 8 and each of the source contact layer 9 and the drain contact layer 10, and filled with an oxide film 11. After that, a source electrode 13 and a drain electrode 14 both of which are made of, for example, gold-germanium or the like are formed so as to be brought into contact with the source contact layer 9 and the drain contact layer 10, respectively. Each of the source electrode 13 and the drain electrode 14 may be made of a plurality of low resistance materials having been stacked together to form a laminated structure.

In order to reduce its parasitic resistance, the first n-type AlGaAs layer 4 partially forming the carrier supply layer 7 has a relatively high impurity concentration, as described above. On the other hand, with respect to the second n-type AlGaAs layer 5, in order to reduce a leak current and increase the gate breakdown strength, the second n-type AlGaAs layer 5 is formed so as to be the lowest in impurity concentration among the three n-type AlGaAs layers 4, 5 and 6. These layers 4, 5 and 6 are piled up to form the carrier supply layer 7. As for the third n-type AlGaAs layer 6, in order to reduce the parasitic resistance, the concentration of this third layer 6 is made relatively high. Further, this third layer 6 is formed in a portion of each of the recess portions (which are defined between the gate electrode 8 and each of the source contact layer 9 and the drain contact layer 10), but not formed in a position directly under the gate electrode 8 at all. By the way, the buffer layer 2 is so formed as to prevent the carrier supply layer 7 from being affected by a surface crystalline condition of the semi-insulating GaAs substrate 1.

As described above, the third n-type AlGaAs layer 6 forming an essential part of the carrier supply layer 7 has a film thickness of from 3 to 8 nm, which film thickness is substantially equal to that of a corresponding preform or roughly shaped one of the third n-type AlGaAs layer 6 as will be described later, wherein an exposed portion of the preform has been already removed through a series of etching processes prior to the formation of the gate electrode 8.

In the first embodiment having the above construction shown in FIG. 1, the carrier supply layer 7 constructed of the n-type AlGaAs layers 4, 5 and 6 supplies carriers to a surface of the undoped InGaAs layer 1 to form a two-dimensional electron layer 12 between: an undoped n-type InGaAs layer serving as a channel layer; and, the first n-type AlGaAs layer 4. In operation, electrons in this two-dimensional electron layer 12 flow across the carrier supply layer 7 to produce a tunnel current, which makes it possible for electrons to move between the source electrode 13 and the drain electrode 14, whereby a drain current is produced to enhance the operation of the FET.

In the above construction (shown in FIG. 1) of the first embodiment, the third n-type AlGaAs layer 6 forms the uppermost layer among the first n-type AlGaAs layer 4, the second n-type AlGaAs layer 5 and the third n-type AlGaAs layer 6, which layers are piled up in this order to form the carrier supply layer 7. In effect, the uppermost layer 6 in the carrier supply layer 7 functions to effectively lower a tunnel barrier in the carrier supply layer 7 with respect to the tunnel current reaches the undoped InGaAs layer 3 through the source contact layer 9 and the drain contact layer 10, wherein the undoped InGaAs layer 3 serves as a channel layer. This reduces the parasitic resistance.

Figure 4:
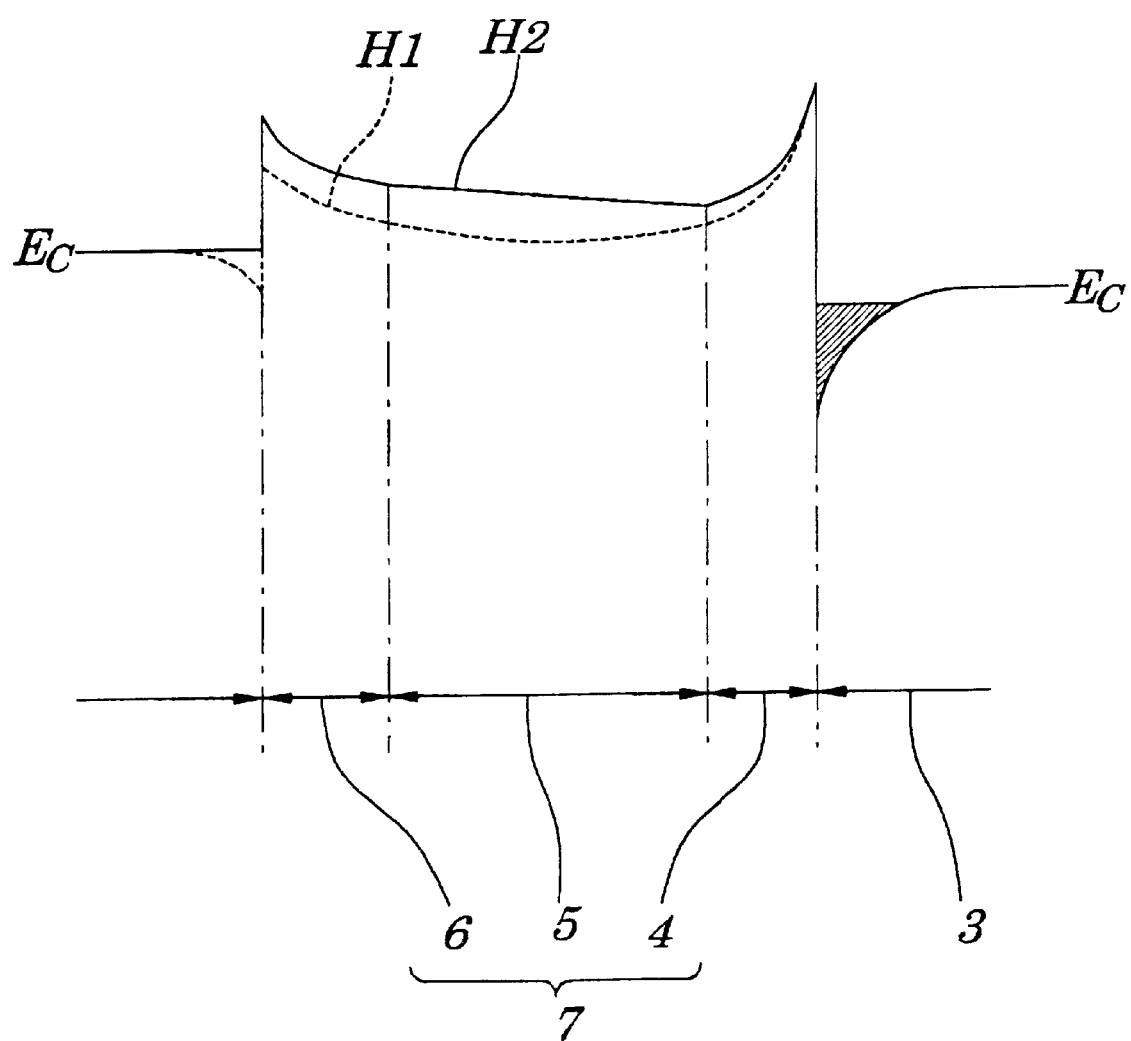
FIG. 4 is an energy band diagram of the semiconductor device of FIG. 1.

FIG. 4 shows an energy band diagram of this first embodiment having the above construction (shown in FIG. 1). In this energy band diagram: the reference letters "Ec" denotes a lower limit of a conduction band energy; "H1" denotes a height of the tunnel barrier in the carrier supply layer 7 in this first embodiment; and, "H2" denotes a conventional height of a corresponding tunnel barrier in the prior art. As is clear from this diagram of FIG. 4 illustrating the comparison of the height "H1" of the present invention with the conventional height "H2", the carrier supply layer 7 to which the third n-type AlGaAs layer having a relatively high impurity concentration is added is capable of lowering in height the tunnel barrier, as is clear from the height "H1" shown in FIG. 4. On the other hand, in a conventional semiconductor device lacks this third n-type AlGaAs layer 6, the tunnel barrier remains high as is clear from the height "H2" shown in FIG. 4. Consequently, this first embodiment of the semiconductor device (shown in FIG. 1) is capable of increasing the tunnel current since it reduces the parasitic resistance.

Further, in this first embodiment, the third n-type AlGaAs layer 6 of the carrier supply layer 7 functions to reduce the influence of the surface potential exerted on the undoped InGaAs layer 3 in the recess portions defined between the gate electrode 8 and each of the source contact layer 9 and the drain contact layer 10. Consequently, it is possible for the first embodiment (shown in FIG. 1) to prevent in electron density the two dimensional electron layer 12 from being reduced, wherein the two-dimensional electron layer 12 is produced in the surface of the undoped InGaAs layer 3.

In this first embodiment of the semiconductor device, it is possible to vary in film thickness the second n-type AlGaAs layer 5 forming the essential part of the carrier supply layer 7. When the film thickness of the the second n-type AlGaAs layer 5 is increased, the first embodiment is formed into a depletion type semiconductor device. On the other hand, when the film thickness of the the second n-type AlGaAs layer 5 is decreased, the first embodiment is formed into an enhancement type semiconductor device.

Figure 2:
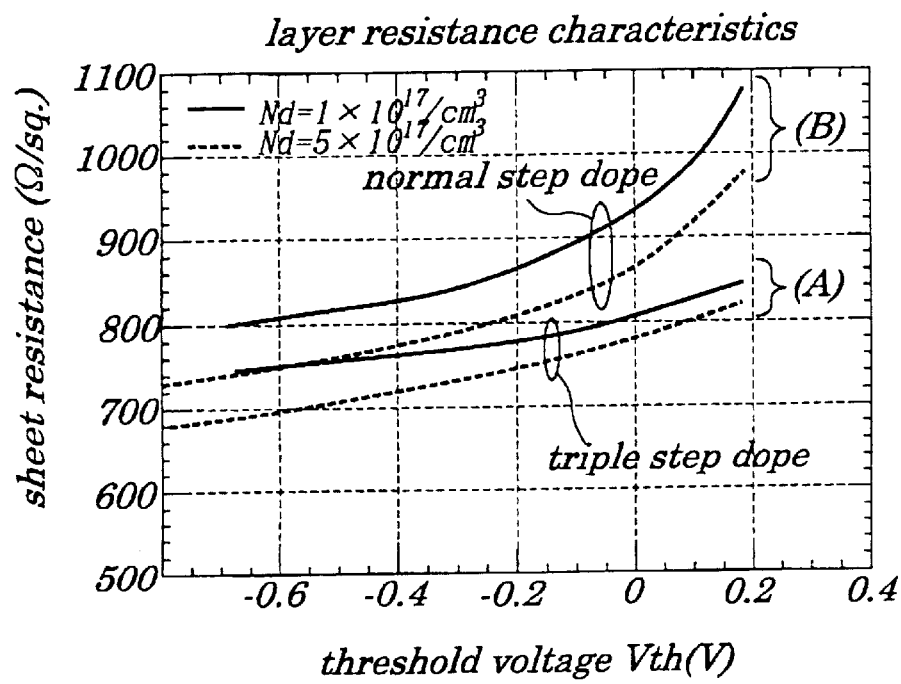
FIG. 2 is a graph illustrating the relationship between the threshold voltage and the sheet resistance of the semiconductor device of FIG. 1.

FIG. 2 shows a graph illustrating the relationship between: a threshold voltage on the horizontal axis; and, a layer resistance (hereinafter referred to as the sheet resistance) on the vertical axis, with respect to the first embodiment (shown in FIG. 1). In the graph of FIG. 2: a pair of curves "A" denote characteristics of the semiconductor deive of the first embodiment; and, a pair of curves "B" denote characteristics of the conventional semiconductor device, wherein: the curves "Nd" shown in solid and in dotted lines show the characteristics of the semiconductor device when the second n-type AlGaAs layer 5 of the carrier supply layer 7 of the device has its impurity concentration varied.

More specifically, in the graph of FIG. 2, the sheet resistance on the vertical axis shows a horizontal component of the sheet resistance in the undoped InGaAs layer 3 serving as the channel layer. In the graph of FIG. 2, the closer an inclination angle of each of the curves from the horizontal axis approaches zero, the more the semiconductor device is improved in performance. Consequently, as is clear from comparison of the curves "A" with the curves "B" in the graph of FIG. 2, since the curves "A" representing the semiconductor device of the first embodiment are smaller in inclination angle than the curves "B" representing the conventional semiconductor device, the semiconductor device of the first embodiment is superior in performance to the conventional semiconductor device.

Figure 3:
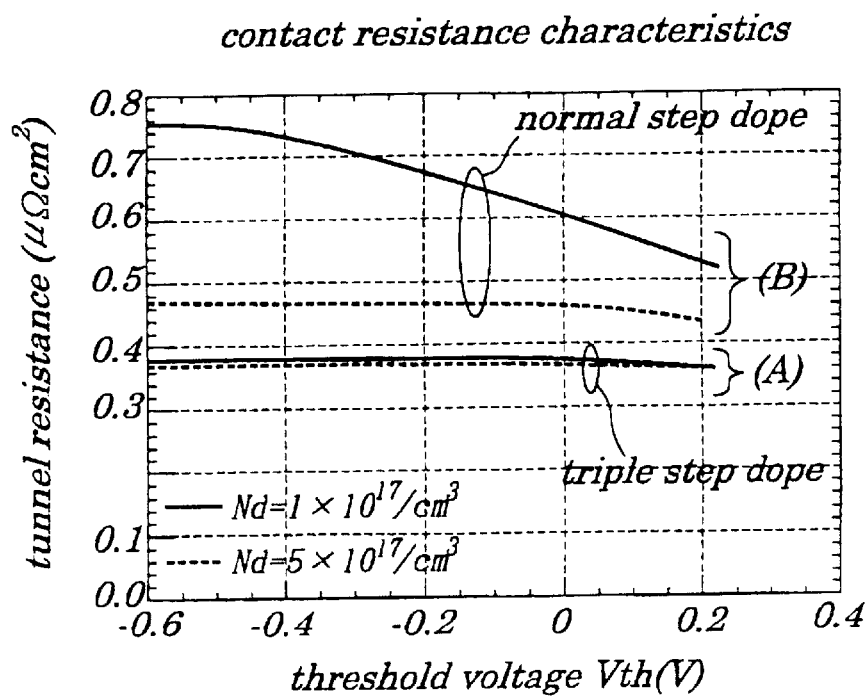
FIG. 3 is a graph illustrating the relationship between the threshold voltage and the tunnel resistance of the semiconductor device of FIG. 1.

FIG. 3 shows a graph illustrating the relationship between: the threshold voltage on the horizontal axis; and, the tunnel resistance on the vertical axis, with respect to the semiconductor device of the first embodiment (shown in FIG. 1). In the graph of FIG. 3: a pair of the curves "A" denote the characteristics of the semiconductor deive of the first embodiment; and, a pair of the curves "B" denote the characteristics of the conventional semiconductor device.

In the graph of FIG. 3, the contact resistance characteristics of the semiconductor device represent a vertical component of a resistance encountered in the carrier supply layer 7 when the tunnel current crosses the carrier supply layer 7, wherein the layer 7 corresponds to a region between the undoped n-type InGaAs layer 3 and the source contact layer 9. In this graph of FIG. 3, the closer an inclination angle of each of the curves from the horizontal axis approaches zero, the more the semiconductor device is improved in performance. Consequently, as is clear from comparison of the curves "A" with the curves "B" in the graph of FIG. 3, since the curves "A" representing the semiconductor device of the first embodiment are smaller in inclination angle than the curves "B" representing the conventional semiconductor device, the semiconductor device of the first embodiment is superior in performance to the conventional semiconductor device.

By the way, the sum of the sheet resistance (shown in FIG. 2) and the vertical component of the resistance encountered in the carrier supply layer 7 (corresponding to the contact resistance characteristics shown in FIG. 3) represents a source resistance "Rs".

Now, with reference to FIGS. 5A, 5B, 6A, 6B, 7A, 7B, 8A and 8B, a product on method of the first embodiment of the semiconductor device will be described.

Figure 5A:
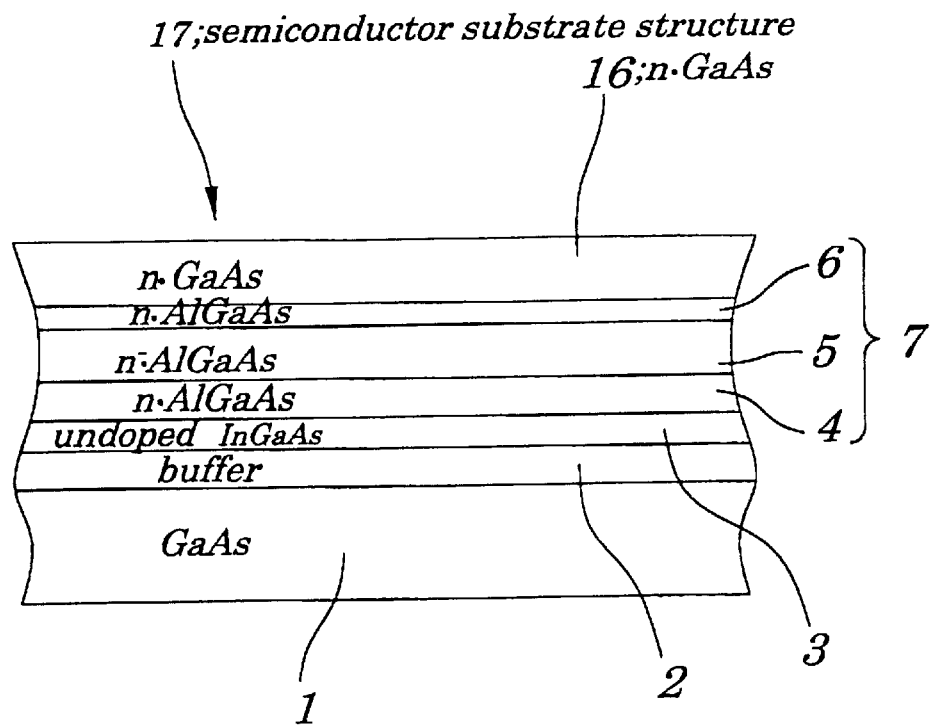
FIG. 5A is a cross-sectional view of the semiconductor device of FIG. 1, illustrating the semiconductor substrate structure thereof.

First, as shown in FIG. 5A, for example, the undoped InGaAs layer 3 is formed on the semi-insulating GaAs substrate 1 through a buffer layer 2 by an MBE (Molecular Beam Epitaxy) process, wherein the buffer layer 2 is constructed of a GaAs layer or the like. Then, successively formed and piled up on this undoped InGaAs layer 3 by the MBE process are: a first n-type AlGaAs layer 4 having a film thickness of from 8 to 12 nm and an impurity concentration of from $2 \times 10^{17}/cm^3$ to $4 \times 10^{17}/cm^3$; the second n-type AlGaAs layer 5 having a film thickness of from 18 to 22 nm, and an impurity concentration of from $1 \times 10^{17}/cm^3$ to $5 \times 10^{17}/cm^3$; and, the third n-type AlGaAs layer 6 having a film thickness of from 3 to 8 nm, and an impurity concentration of from $3 \times 10^{18}/cm^3$ to $5 \times 10^{18}/cm^3$, in this order to form the carrier supply layer 7. After that, formed on this carrier supply layer 7 by the MBE process is an n-type GaAs layer which forms a contact layer's preform 16 (shown in FIG. 6B) having a film thickness of from 50 to 100 nm and an impurity concentration of from $2 \times 10^{18}/cm^3$ to $4 \times 10^{18}/cm^3$, so that the first semiconductor substrate structure 17 of the first embodiment is prepared.

Figure 5B:
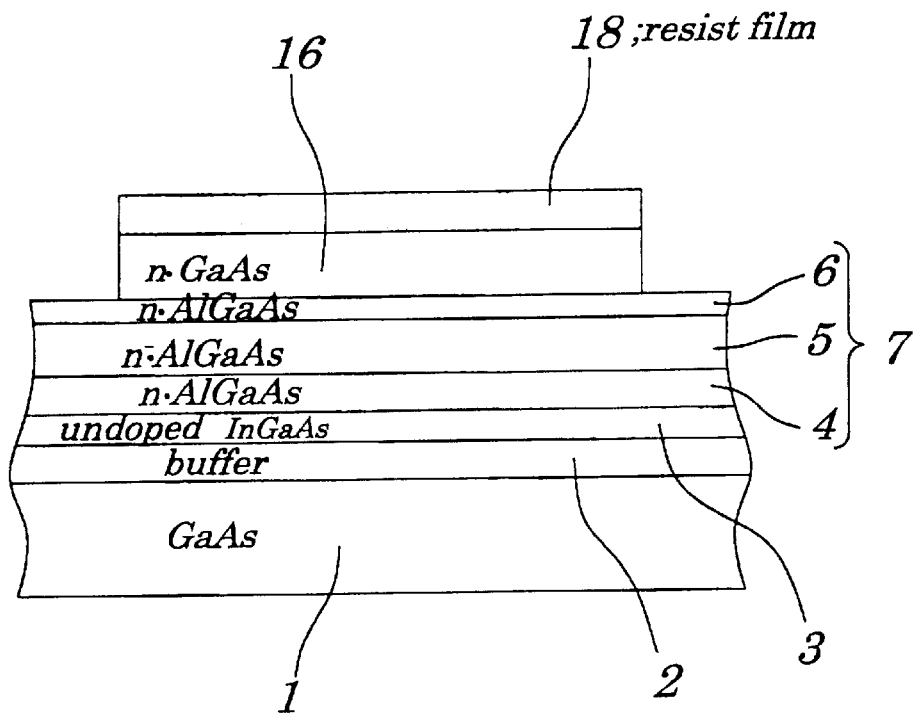
FIG. 5B is a cross-sectional view of the semiconductor device of FIG. 1, illustrating the steps for forming the semiconductor substrate structure.

Next, as shown in FIGS. 5B, in the first semiconductor substrate structure 17, a resist film 18 is applied to only a region of the n-type GaAs layer 16, in which region the FET should be formed. After that, using the resist film 18 as a mask, a dry etching process is performed to remove an unnecessary portion of the n-type GaAs layer 16.

Figure 6A:
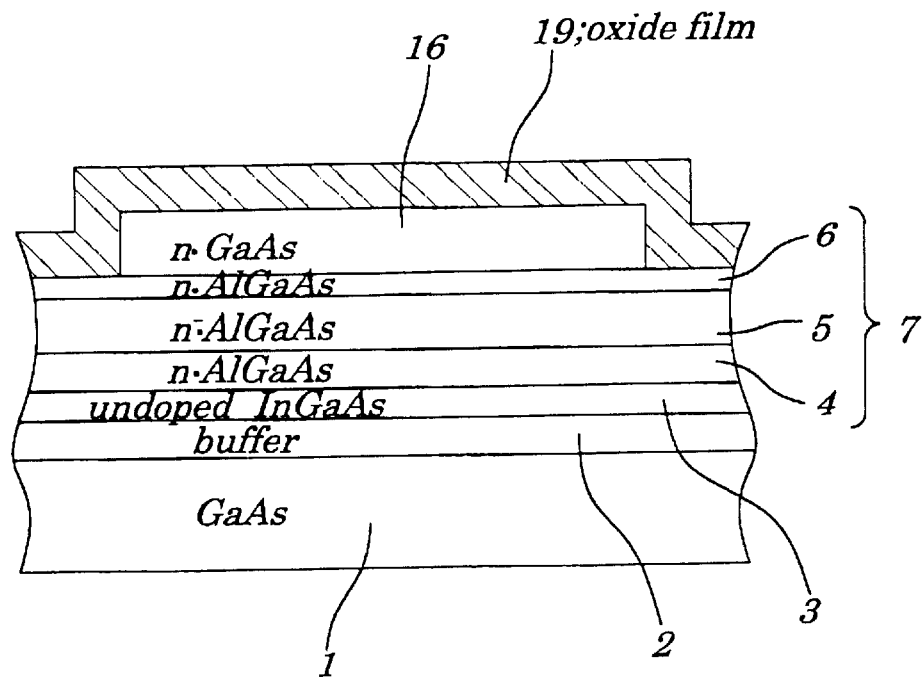
FIG. 6A is a cross-sectional view of the semiconductor device of FIG. 1, illustrating the step for forming an oxide film.

Then, as shown in FIG. 6A, after completion of removal of the resist film 18, an oxide film 19 is formed by a CVD process so as to cover the n-type GaAs layer 16 and to have a film thickness of from 300 to 400 nm.

Figure 6B:
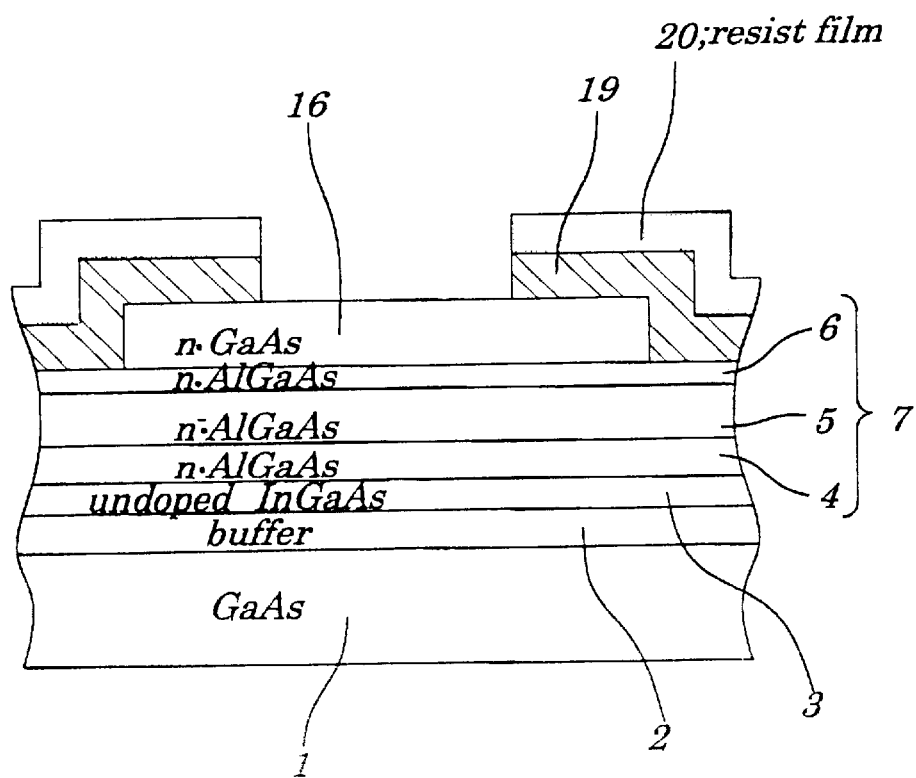
FIG. 6B is a cross-sectional view of the semiconductor device of FIG. 1, illustrating a dry etching process.

Now, as shown in FIG. 6B, the oxide film 19 has its central portion removed. Then, another resist film 20 is applied to only the remaining portion of the oxide film 19. In the thus removed central portion of the oxide film 19, the gate electrode 8 is formed later. Then, the thus applied resist film 20 serves as a mask in a dry etching process for removing the unnecessary portion of the oxide film 19, so that the central portion of the n-type GaAs 16 is exposed to the outside.

Figure 7A:
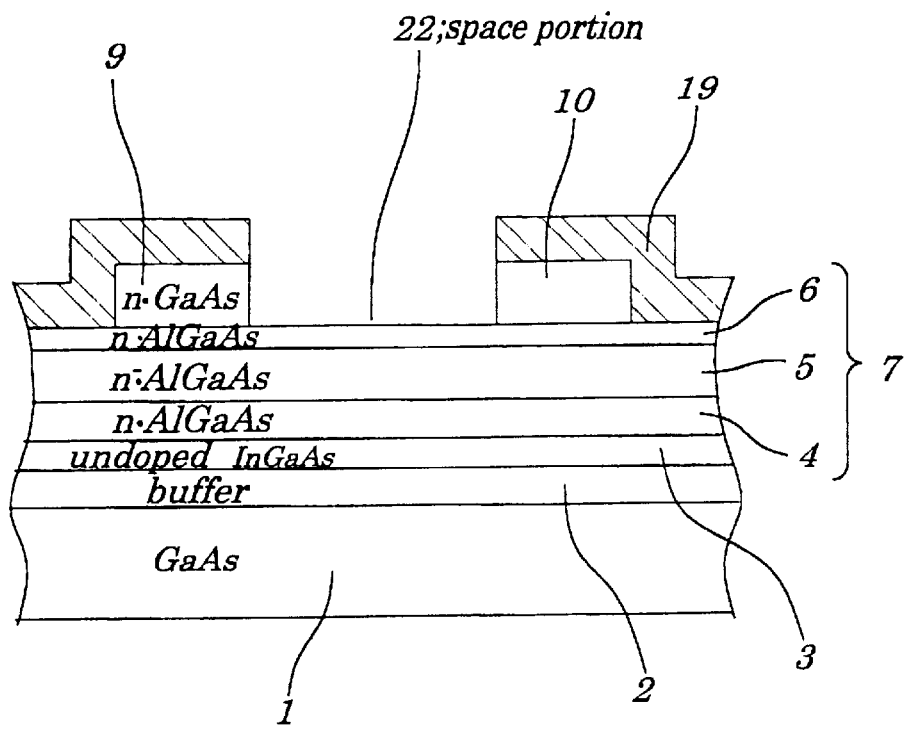
FIG. 7A is a cross-sectional view of the semiconductor device of FIG. 1, illustrating the step for forming the space portion.

Next, as shown in FIG. 7A, after removal of the resist film 20 (shown in FIG. 6B), the third n-type AlGaAs layer 6 is used as an etch stop layer in a dry etching process performed with the use of the oxide film 19 serving as a mask, so that the n-type GaAs 16 is selectively etched to form a space portion 22 in the central portion of the oxide film 19, in which space portion 22 the gate electrode should be formed, whereby the n-type GaAs layer 16 is patterned so as to be divided into the source contact layer 9 and the drain contact layer 10.

Figure 7B:
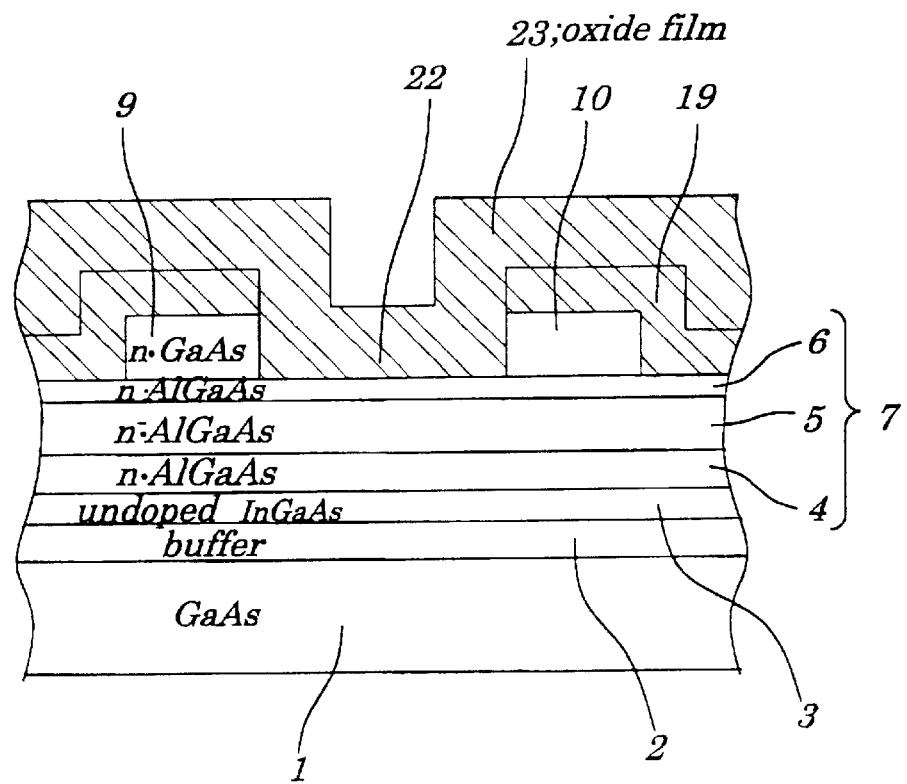
FIG. 7B is a cross-sectional view of the semiconductor device of FIG. 1, illustrating a CVD (Chemical Vapor Deposition) process.
Figure 8A:
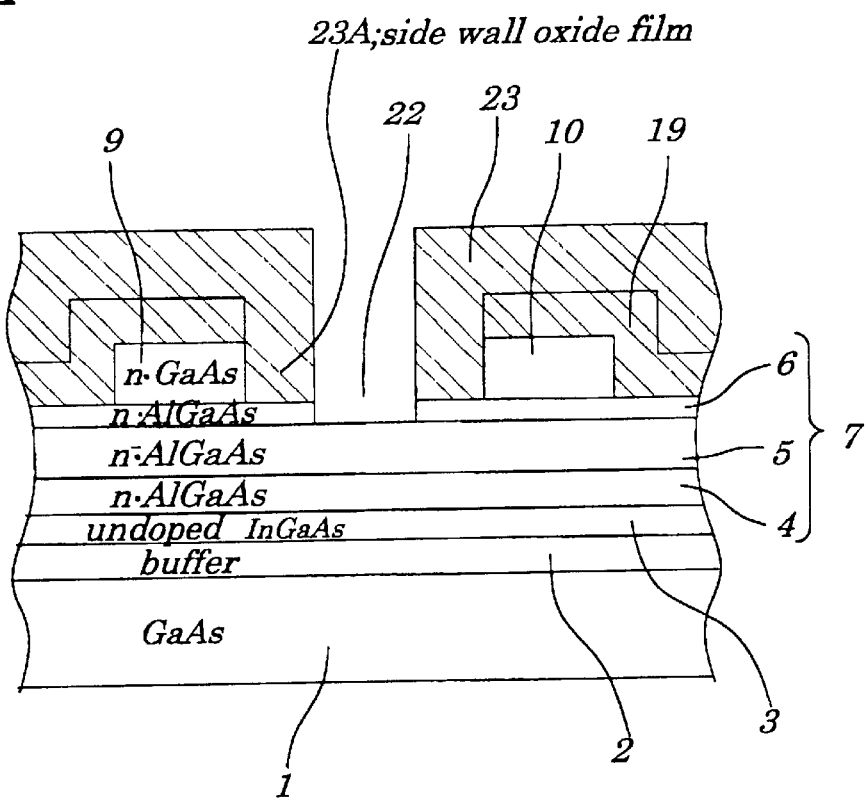
FIG. 8A is a cross-sectional view of the semiconductor device of FIG. 1, illustrating an anisotropic etching process.

Next, as shown in FIG. 7B, an oxide film 23 having a film thickness of from 200 to 300 nm is formed over the entire surface of the semiconductor substrate including the space portion 22 by the CVD process. Then, as shown in FIG. 8A, an anisotropic etching process is performed to selectively remove both: the oxide film 23 formed in the space portion 22; and, a portion of the third n-type AlGaAs layer 6, which portion is located directly under this oxide film 23, so that a surface of the second n-type AlGaAs layer 5 is exposed to the outside. By the way, in the above process step, even when the third n-type AlGaAs layer 6 remains unremoved, it is possible to completely remove such unremoved third n-type AlGaAs layer 6 through cleaning treatment, wherein such cleaning treatment is conducted later as one of after-treatments. On the other hand, the oxide film 23 remaining on a sidewall of each of the source contact layer 9 and the drain contact layer 10 forms a sidewall oxide film 23A. This oxide film 23A is very small in film thickness, which makes it possible to reduce in dimension the recess portions.

Figure 8B:
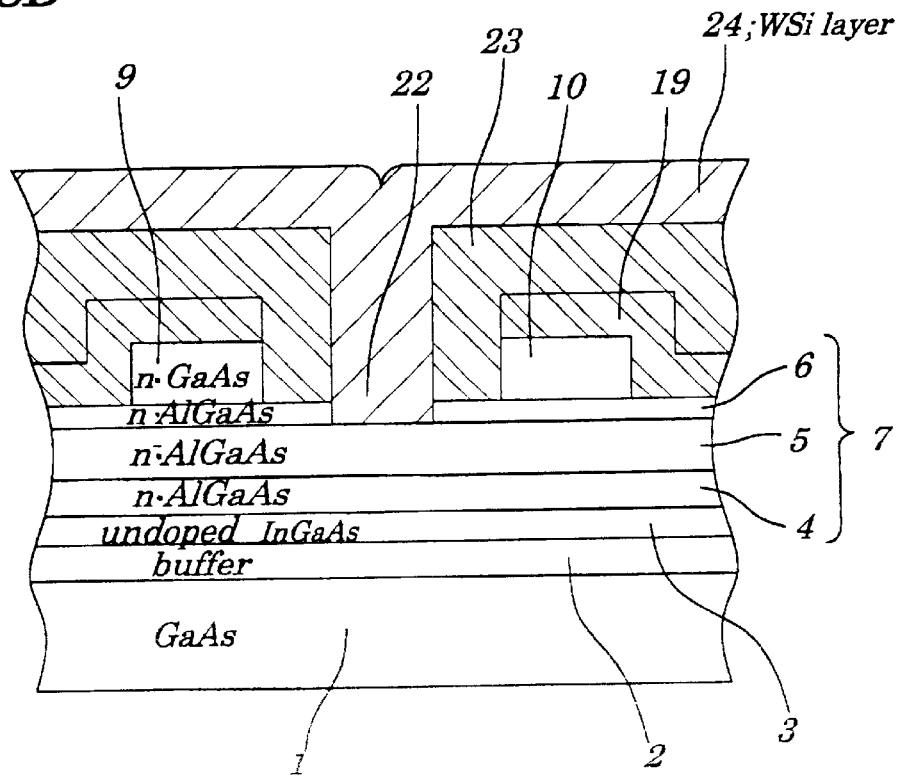
FIG. 8B is a cross-sectional view of the semiconductor device of FIG. 1, illustrating a sputtering process for forming a Wsi layer.

Next, after completion of the cleaning treatment performed as an after-treatment, as shown in FIG. 8B, a tungsten silicide (WSi) layer 24 is formed over the entire surface of the semiconductor substrate including the space portion 22 by a sputtering process. Then, the WSi layer 24 is patterned to form the gate electrode 8. After the gate electrode 8 has been formed, the source electrode 13 and the drain electrode 14 are so formed as to be brought into contact with the source contact layer 9 and the drain contact layer 10, respectively, as shown in FIG. 1, whereby the first embodiment of the semiconductor device is completed.

As described above, in this first embodiment having the above construction, first, the undoped InGaAs layer 3 is completed. Then, successively formed and piled up on this undoped InGaAs layer 3 are: the first n-type AlGaAs layer 4, the second n-type AlGaAs layer 5 and the third n-type AlGaAs layer 6 in this order to form the carrier supply layer 7. Among the first n-type AlGaAs layer 4, the second n-type AlGaAs layer 5 and the third n-type AlGaAs layer 6, the second n-type AlGaAs layer 5 is the lowest in impurity concentration. Then, the gate electrode 8 is formed in a manner such that the Schottky junction is formed in this second n-type AlGaAs layer 5 in a condition in which the third n-type AlGaAs layer 6 is so formed as to be brought into contact with the opposite sides of the gate electrode 8. Consequently, there is any high concentration layer in a position directly under the gate electrode 8.

As a result, it is possible for the production method of the present invention to produce the first embodiment of the semiconductor device capable of reducing the parasitic resistance without: using any expensive special technique; increasing the leak current; and, decreasing the gate breakdown strength or voltage.

Second Embodiment

Figure 9:
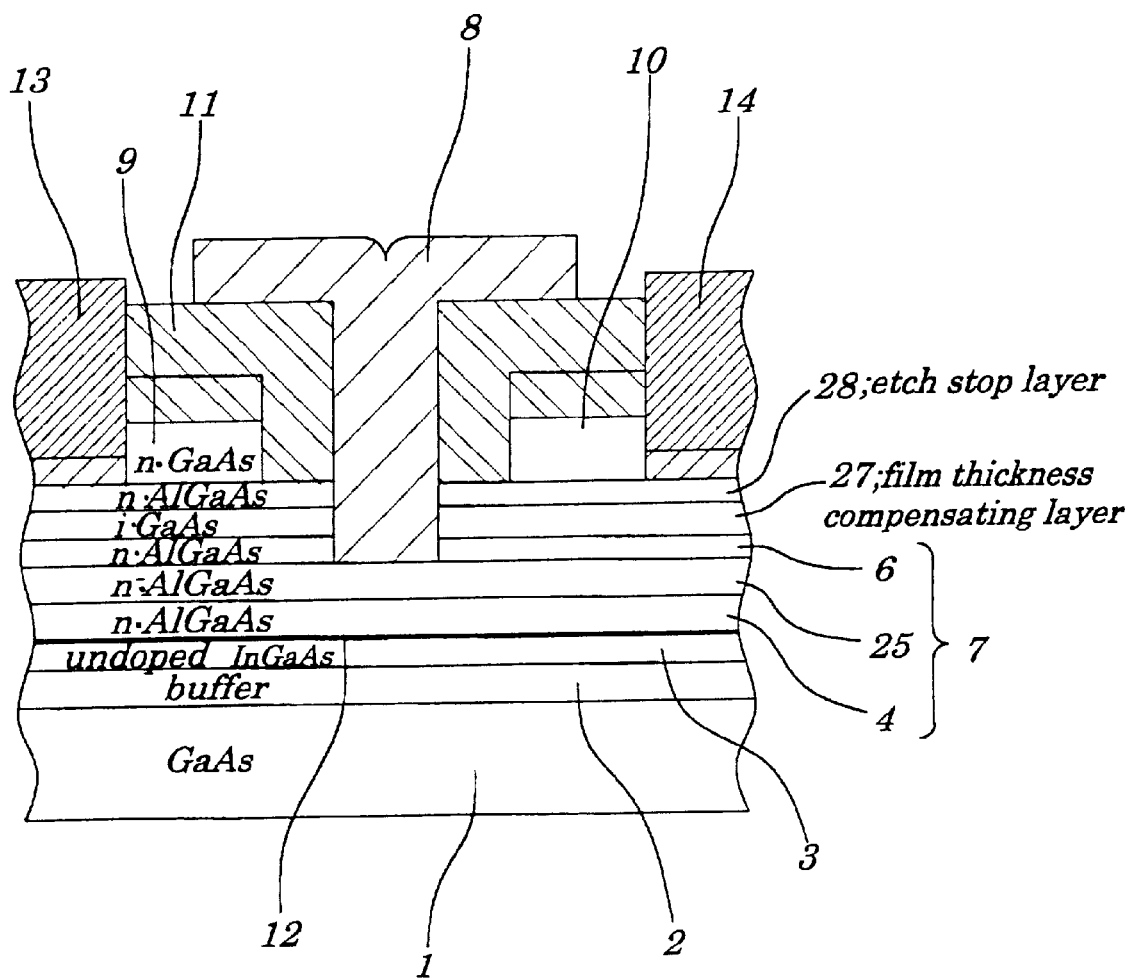
FIG. 9 is a cross-sectional view of a second embodiment of the semiconductor device of the present invention.

FIG. 9 shows a cross-sectional view of a second embodiment of the semiconductor device of the present invention.

The big difference between this second embodiment and the first embodiment (shown in FIG. 1) is that the second embodiment has its film thickness compensating layer 27 construction especially adapted for the enhancement type FET.

As is clear from FIG. 9, in the semiconductor device of the second embodiment, the second n-type AlGaAs layer 25 forming an essential part of the carrier supply layer 7 has a film thickness of from 8 to 10 nm, which is approximately half the film thickness of the second n-type AlGaAs layer 6 of the first embodiment (shown in FIG. 1), whereby the semiconductor device of the second embodiment (shown in FIG. 9) has its construction adapted for the enhancement type FET. As for the impurity concentration, there is substantially no difference between the second n-type AlGaAs layer 25 of the second embodiment and the corresponding one 6 of the first embodiment.

As shown in FIG. 9, when the second embodiment has its second n-type AlGaAs layer 25 with a low impurity concentration reduced in film thickness as described above, a distance between the lowest end surface of the gate electrode 8 and the undoped n-type InGaAs layer 3 and another distance between the source contact layer 9 and the undoped n-type InGaAs layer 3 are reduced. Due to such reduction in distance, the parasitic resistance is inevitably increased. Consequently, in order to remove such disadvantage, the semiconductor device of the second embodiment is provided with a film thickness compensating layer 27 for compensating the above reduction in distance. More specifically, the film thickness compensating layer 27 is formed on the third n-type AlGaAs layer 6, and has a film thickness of from 10 to 20 nm to make it possible to decrease the parasitic resistance. The film thickness compensating layer 27 is formed as a high resistance i-GaAs (intrinsic-GaAs) layer, and therefore has an impurity concentration of from $1 \times 10^{14}/cm^3$ to $1 \times 10^{15}/cm^3$ to form. In order to prevent the gate breakdown strength from decreasing, it is necessary for the film thickness compensating layer 27 to stay low in impurity concentration. In other words, it is preferable to keep the film thickness compensating layer 27 high in resistance.

As described above, in the second embodiment, the above-mentioned distance is increased by the provision of the film thickness compensating layer 27. After that, an etch stop layer 28 constructed of an n-type AlGaAs layer is formed on the film thickness compensating layer 27 (constructed of the high resistance i-GaAs layer) in a manner such that the etch stop layer 28 is disposed adjacent to the opposite sides of the gate electrode 8. There is substantially no difference in film thickness and in impurity concentration between the etch stop layer 28 and the third n-type AlGaAs layer 6. As will be described later, the etch stop layer 28 functions to prevent the film thickness compensating layer 27 disposed directly under the layer 27 from being etched when the contact layer's preform 16 (shown in FIG. 6B) is selectively etched.

In construction, the remaining portion of the second embodiment except for the above is substantially the same as that of the first embodiment. Consequently, in FIG. 9, the parts which are the same as ones in FIG. 1 have been given the same reference numerals, and therefore are not further explained to avoid redundancy in description.

In the second embodiment (shown in FIG. 9) having the above construction, even when the second embodiment has the film thickness of the second n-type AlGaAs layer 25 reduced so as to be especially adapted for the enhancement type FET, it is possible for the second embodiment to prevent the above-mentioned distance between the undoped n-type InGaAs layer 3 and the surface of the carrier supply layer 7 from decreasing by additionally forming the film thickness compensating layer 27 (constructed of the i-GaAs layer) on the third n-type AlGaAs layer 6. Consequently, according to the present invention, it is possible to produce the in semiconductor device of the second embodiment capable of reducing the parasitic resistance, without: increasing the leak current; and, decreasing the gate breakdown strength. Consequently, it is possible for the semiconductor device of the second embodiment to have substantially the same characteristics as those of the graphs shown in FIGS. 2 and 3.

As described above, by obtaining the enhancement type FET which is stable in operation, it is possible for the present invention to realize a semiconductor device capable of operating with the application of a single positive power supply for establishing a gate voltage and a drain voltage of the semiconductor device. Due to this, the semiconductor device of the present invention may find widespread application in the second embodiment.

Now, with reference to FIGS. 10A, 10B, 11A and 11B, a production method of the semiconductor device of the second embodiment will be described.

Figure 10A:
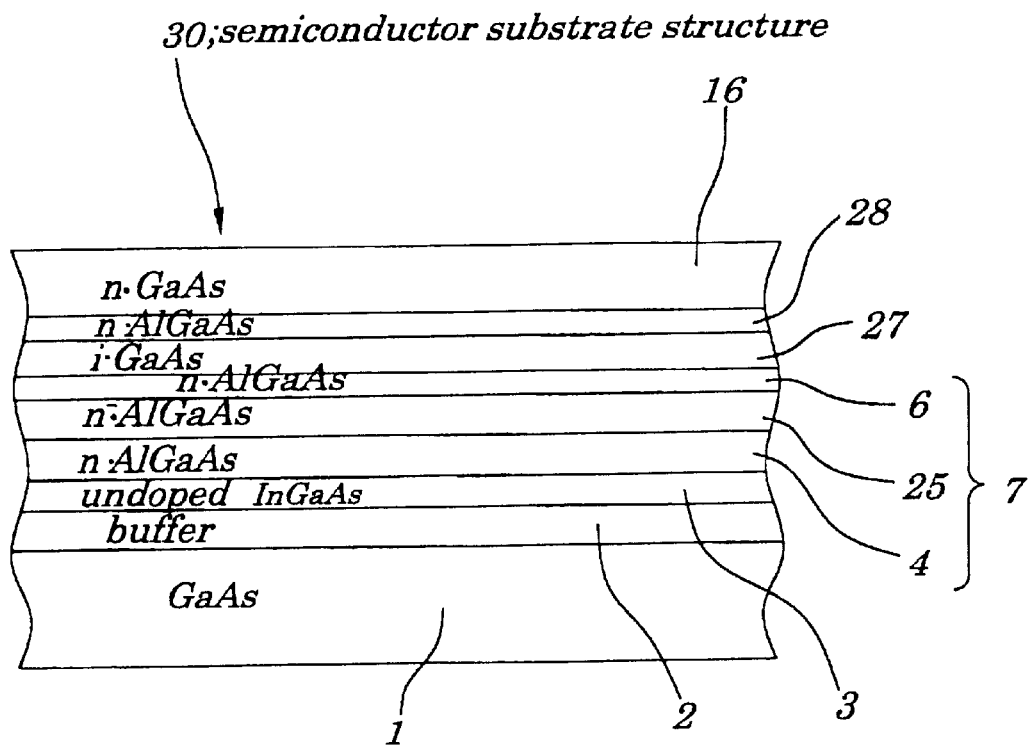
FIG. 10A is a cross-sectional view of the semiconductor device of FIG. 9, illustrating the semiconductor substrate structure thereof.

First, as shown in FIG. 10A, in place of the first semiconductor substrate structure 17 used in the production method of the first embodiment shown in FIG. 4A, the production method of the second embodiment uses a second semiconductor substrate structure 30 as its starting substrate. In this second semiconductor substrate structure 30, the etch stop layer 28 constructed of the n-type AlGaAs layer is additionally formed on the film thickness compensating layer 27 (constructed of the high resistance GaAs layer) between the third n-type AlGaAs layer 6 and the n-type GaAs layer 16, whereas there is no additional layer between the third n-type AlGaAs layer 6 and the n-type GaAs layer 16 in the first semiconductor substrate structure 17 (shown in FIG. 5A). By the way, the film thickness of the second $n^-$-type AlGaAs layer 25 in the second semiconductor substrate structure 30 is approximately half the film thickness of the corresponding second $n^-$-type AlGaAs layer 5 of the first semiconductor substrate structure 17.

Figure 10B:
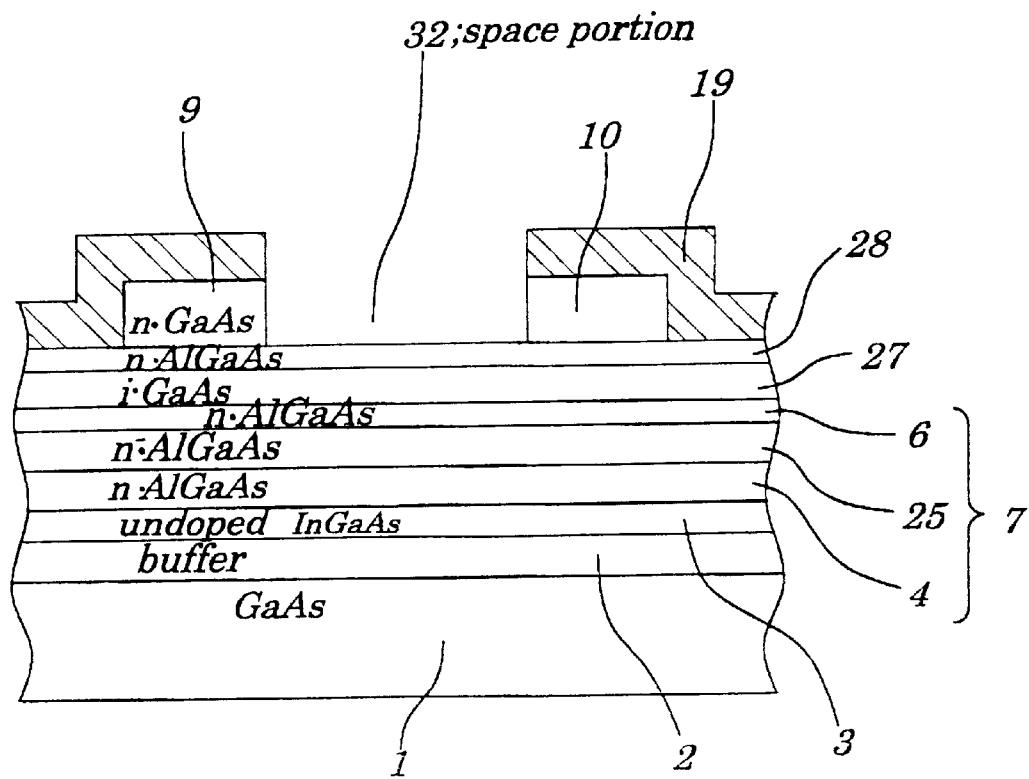
FIG. 10B is a cross-sectional view of the semiconductor device of FIG. 9, illustrating the space portion.
Figure 11A:
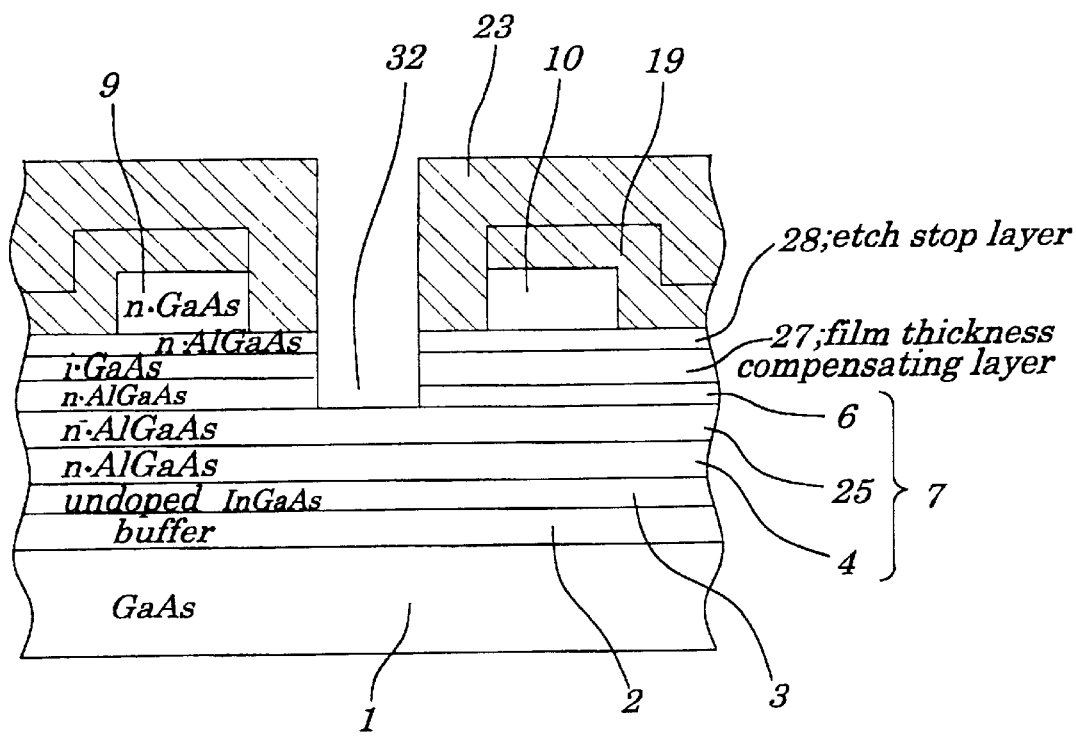
FIG. 11A is a cross-sectional view of the semiconductor device of FIG. 9, illustrating the anisotropic etching process.
Figure 11B:
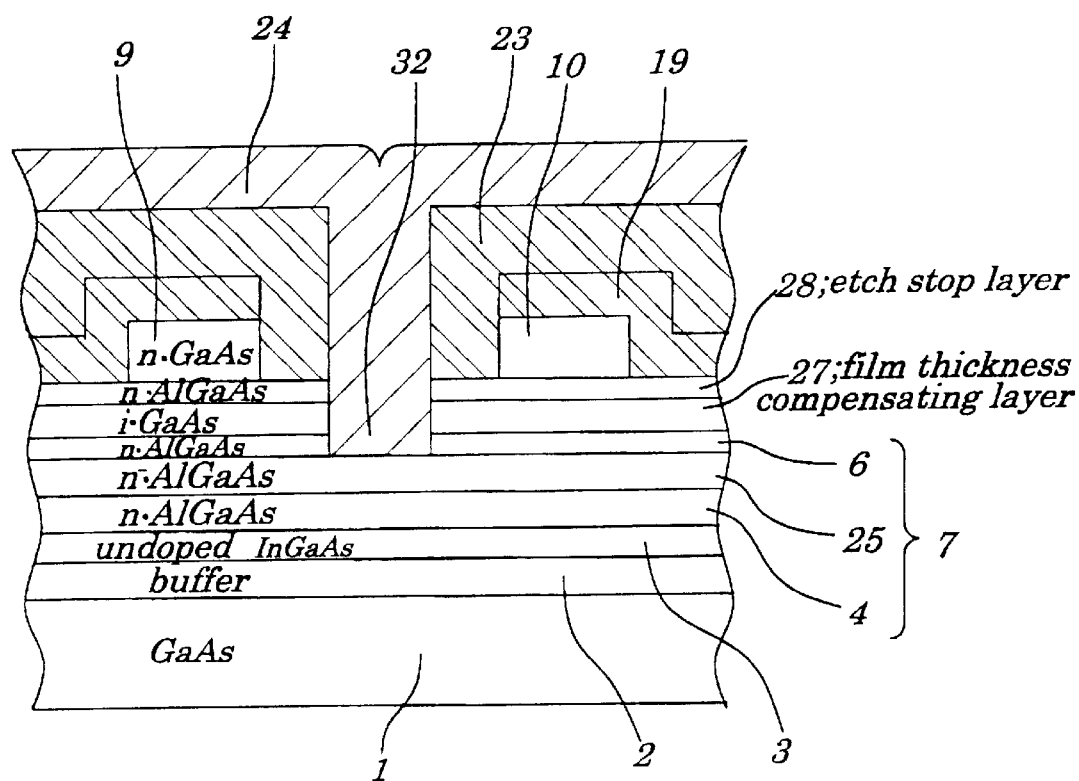
FIG. 11B is a cross-sectional view of the semiconductor device of FIG. 9, illustrating the sputtering process for forming the Wsi layer.
Figure 12:
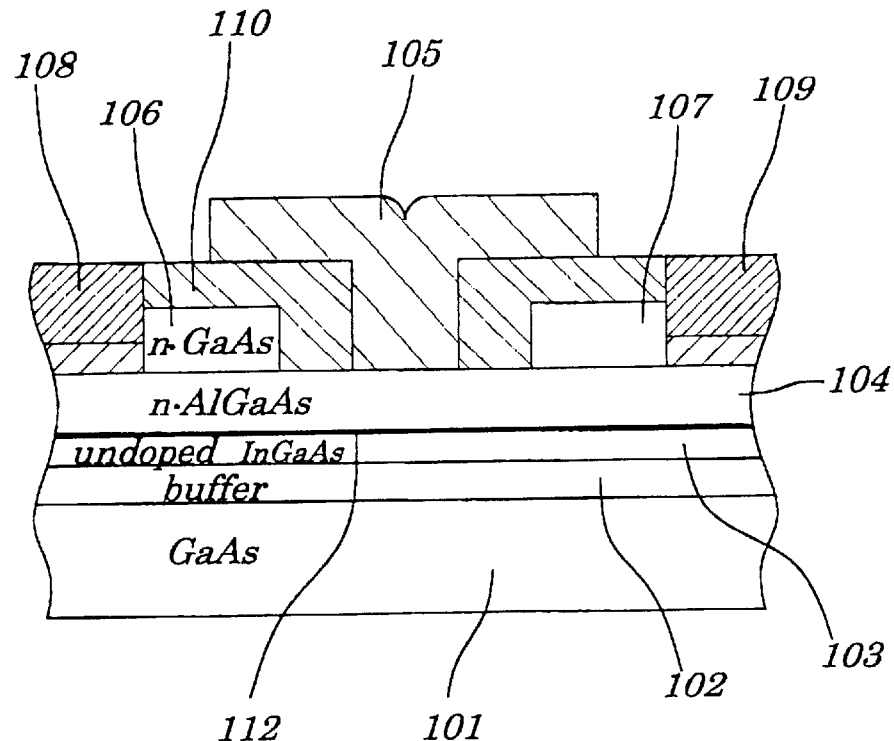
FIG. 12 is a cross-sectional view of the first conventional semiconductor device.
Figure 13:
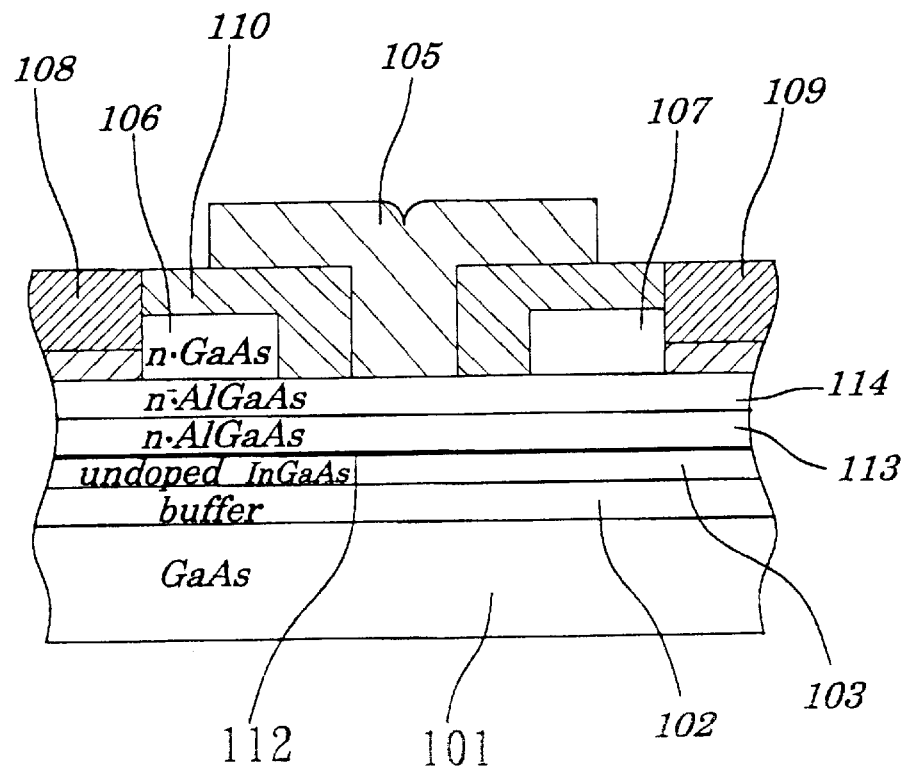
FIG. 13 is a cross-sectional view of the second conventional semiconductor device.
Figure 14:
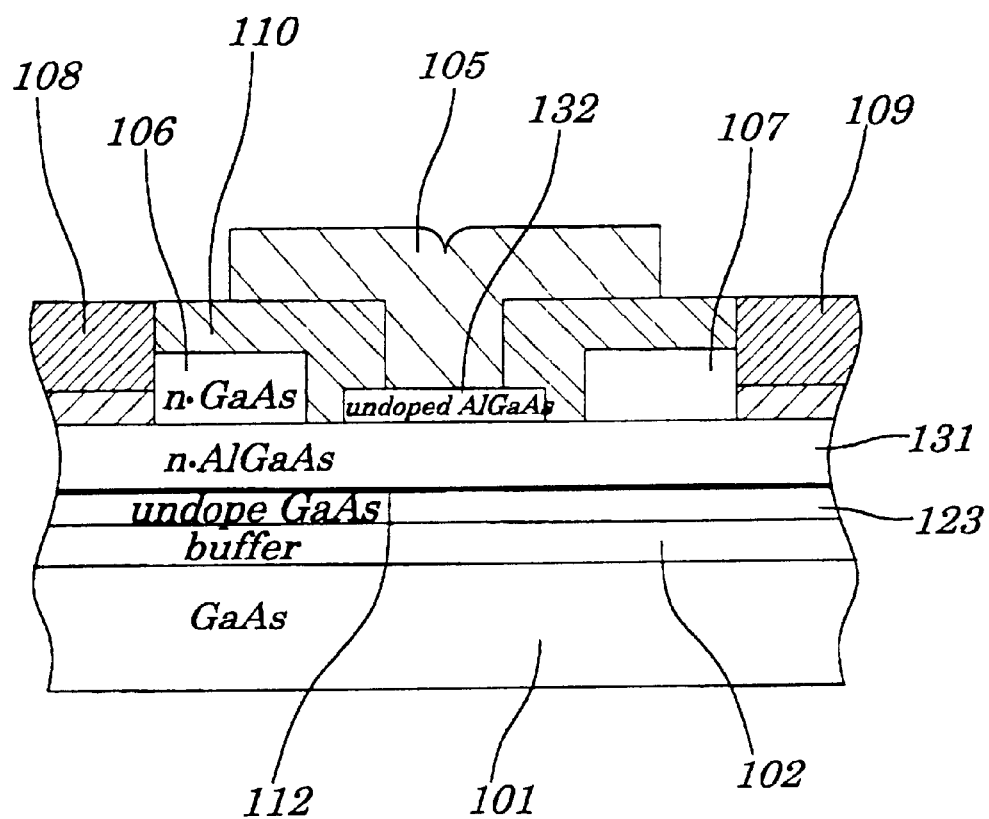
FIG. 14 is a cross-sectional view of the third conventional semiconductor device.

Then, substantially the same processes as those described with reference to the FIGS. 5B, 6A, 6B, 7A and 7B are performed. After that, as shown in FIG. 10B, with the use of the etch stop layer 28 constructed of the n-type AlGaAs layer, a dry etching process is performed using the oxide film 19 as a mask so that the n-type GaAs layer 16 is selectively etched to form the space portion 22 in a portion where the gate electrode (a gate preform 24 of which is shown in FIG. 11B) should be formed. Due to this, the n-type GaAs layer 16 is divided into the source contact layer 9 and the drain contact layer 10 through patterning.

After that, substantially the same processes as those described with reference to the FIGS. 7A, 7B, 8A and 8B are performed. After that, as shown in FIG. 11A, the anisotropic etching process is performed to selectively remove the oxide film 23 of the space portion 22 together with the etch stop layer 28 (constructed of the n-type AlGaAs layer) located directly under this oxide film 23. Then, substantially the same anisotropic etching operation as that described above is repeated to selectively remove the film thickness compensating layer 27 (constructed of the high resistance GaAs layer) and the third n-type AlGaAs layer 6 (located directly under this film thickness compensating layer 27). As a result, as is clear from FIG. 11A, a surface of the second $n^-$-type AlGaAs layer 25 in the second semiconductor substrate structure 30 is exposed to the outside. By the way, in this stage, even when the third n-type AlGaAs layer 6 remained unremoved in the thus exposed surface of the $n^-$-type AlGaAs layer 25, such residue of the $n^-$-type AlGaAs layer 25 is completely removed through the after-treatment called the cleaning treatment which will be described later. On the other hand, the oxide film 23 remaining on the sidewalls of the source contact layer 9 and the drain contact layer 10 forms the sidewall oxide film 23A. The film thickness of this sidewall oxide film 23A is very thin, which makes it possible to reduce in dimension the recess portions.

After that, substantially the same processes as those described with reference to the FIG. 8B are performed. After that, as shown in FIG. 11B, the after-treatment called the cleaning treatment is performed. Then, the sputtering process is performed so that the gate preform 24 (constructed of the WSi layer) of the gate electrode is formed over the entire surface of the semiconductor substrate including the space portion 32. After that, the gate perform 24 is patterned to form the gate electrode corresponding to the gate electrode 8 of the first embodiment shown in FIG. 1. After completion of the gate electrode of the second embodiment, the source electrode 13 and the drain electrode 14 are formed in the source contact layer 9 and the drain contact layer 10, respectively, so that the semiconductor device of this second embodiment is completed.

As described above, this second embodiment is capable of obtaining substantially the same effect as that obtained in the first embodiment.

In addition, in this second embodiment, it is possible to produce the enhancement type heterojunction FET. Consequently, the second embodiment may find widespread application in the field where the semiconductor device must be operated with a single power supply.

While the embodiments of the present invention have been described in the above in detail with reference to the drawings, it will be understood by those skilled in the art that various changes in form and details in design may be made therein without departing from the spirit and scope of the present invention as defined by the appended claims. For example, although the heterojunction is formed between the InGaAs layer and the AlGaAs layer in the above embodiments, it is also possible to form the heterojunction between an InGaAs layer and an InAlAs layer, or between a GaAs layer and an AlGaAs layer. Further, in the above embodiments, it is not necessarily required to have the third n-type AlGaAs layer disposed adjacent to a side surface of the gate electrode.

Still further, the film thickness compensating layer used in the second embodiment is not necessarily constructed of the high resistance GaAs layer. In other words, in place of such the high resistance GaAs layer, it is possible to use any other suitable compound semiconductor layer, provided that an impurity concentration of such compound semiconductor layer is within a range of values capable of preventing any reduction of the gate breakdown strength in operation. Further, as for the etch stop layer formed on this film thickness compensating layer, it is not necessary for the etch stop layer to be brought into contact with the side surface of the gate electrode. In the above description of the present invention, though various kinds of the compound semiconductor layers, materials of the conductive layers, variation in film thickness, various impurity concentrations, and various processes for forming the films have been described, they are mere examples, and therefore may vary in accordance with individual applications and uses.

It is also possible with the clamp circuit to prevent the operating performance of a signal level input to the ECL logic circuit from lowering, thus preventing the transistor from operating at its saturation region.

Finally, the present application claims the Convention Priority based on Japanese Patent Application No. Hei 11-157117 filed on Jun. 3, 1999, which is herein incorporated by reference.

What is claimed is:

1. In a semiconductor device provided with a compound semiconductor substrate on which an undoped compound semiconductor layer serving as a channel layer is formed, wherein a plurality of n-type compound semiconductor layers are successively formed and piled up on said channel layer to form a carrier supply layer, the improvement wherein:

said carrier supply layer is constructed of a first, a second and a third n-type compound semiconductor layer;

said second n-type compound semiconductor layer is the lowest in impurity concentration among said first, said second and said third n-type compound semiconductor layer; and a gate electrode is formed so as to be encircled with said third n-type compound semiconductor layer, and to have a Schottky junction formed in said second n-type compound semiconductor layer.

2. The semiconductor device according to claim 1, wherein said undoped compound semiconductor layer serving as said channel layer is constructed of an InGaAs layer.

3. The semiconductor device according to claim 1, wherein said first, said second and said third n-type compound semiconductor layer forming said carrier supply layer is respectively constructed of a first, a second and a third n-type AlGaAs layer.

4. The semiconductor device according to claim 3, wherein each of a source contact layer and a drain contact layer is constructed of an n-type GaAs layer on said third n-type AlGaAs layer in each of opposite sides of said gate electrode so as to be spaced apart from said gate electrode; and an insulation film is formed between each of said source contact layer and said drain contact layer and said gate electrode.

5. The semiconductor device according to claim 3, wherein said third n-type AlGaAs layer has a film thickness substantially equal to that of a corresponding contact layer of said third n-type compound semiconductor layer or of an etch stop layer, wherein an exposed portion of said contact layer has been already removed through a series of etching processes prior to the formation of said gate electrode.

6. In a semiconductor device provided with a compound semiconductor substrate on which an undoped compound semiconductor layer serving as a channel layer is formed, wherein a plurality of n-type compound semiconductor layers are successively formed and piled up on said channel layer to form a carrier supply layer, the improvement wherein:

said carrier supply layer is constructed of a first, a second and a third n-type compound semiconductor layer;

said second n-type compound semiconductor layer is the lowest in impurity concentration among said first, said second and said third n-type compound semiconductor layer;

an etch stop layer is formed above said third n-type compound semiconductor layer on a film thickness compensating layer; and a gate electrode is formed so as to have a Schottky junction formed in said second n-type compound semiconductor layer, wherein said gate electrode is encircled with at least both of said third n-type compound semiconductor layer and said film thickness compensating layer.

7. The semiconductor device according to claim 6, wherein said undoped compound semiconductor layer serving as said channel layer is constructed of an InGaAs layer.

8. The semiconductor device according to claim 6, wherein said first, said second and said third n-type compound semiconductor layer forming said carrier supply layer is respectively constructed of a first, a second and a third n-type AlGaAs layer.

9. The semiconductor device according to claim 6, wherein said film thickness compensating layer is constructed of a high resistance GaAs layer.

10. The semiconductor device according to claim 6, wherein said etch stop layer is made of the same material as that of said third n-type compound semiconductor layer.

11. The semiconductor device according to claim 8, wherein:

each of a source contact layer and a drain contact layer is constructed of an n-type GaAs layer on said third n-type AlGaAs layer in each of opposite sides of said gate electrode so as to be spaced apart from said gate electrode; and an insulation film is formed between: each of said source contact layer and said drain contact layer; and, said gate electrode.

12. The semiconductor device according to claim 8, wherein said third n-type AlGaAs layer has a film thickness substantially equal to that of a corresponding contact layer of said third n-type compound semiconductor layer or of said etch stop layer, wherein an exposed portion of said contact layer has been already removed through a series of etching processes prior to the formation of said gate electrode.

13. The semiconductor device according to claim 10, wherein said etch stop layer has a film thickness substantially equal to that of a corresponding contact layer of said third n-type compound semiconductor layer or of said etch stop layer, wherein an exposed portion of said contact layer has been already removed through a series of etching processes prior to the formation of said gate electrode.

14. A semiconductor substrate structure comprising:
an undoped InGaAs layer formed above a compound semiconductor on a buffer layer, wherein said undoped InGaAs layer serves as a channel layer;
a carrier supply layer constructed of a first, a second and a third n-type AlGaAs layers which are successively piled up on said undoped InGaAs layer in this order to form said carrier supply layer, wherein said second n-type AlGaAs layer is the lowest in impurity concentration among said first, said second and said third n-type AlGaAs layers; and
a contact layer formed on said third n-type AlGaAs layer, wherein said contact layer is constructed of an n-type GaAs layer substrate.

15. The semiconductor substrate structure according to claim 14, wherein an etch stop layer is constructed of an n-type AlGaAs layer, and formed above said third n-type AlGaAs layer on a film thickness compensating layer, wherein said film thickness compensating layer is constructed of a high resistance GaAs layer.

* * * * *